United States Patent [19]
Canada et al.

[11] Patent Number: 5,726,911
[45] Date of Patent: Mar. 10, 1998

[54] ELECTRIC MOTOR MONITOR

[75] Inventors: Ronald G. Canada, Knoxville; Eugene F. Pardue, Lenoir City; James C. Robinson, Knoxville, all of Tenn.

[73] Assignee: CSI Technology, Inc., Wilmington, Del.

[21] Appl. No.: 697,335

[22] Filed: Aug. 22, 1996

[51] Int. Cl.[6] .............................. G01K 3/04; H02H 7/085
[52] U.S. Cl. ........................ 364/550; 318/434; 318/490; 361/23
[58] Field of Search ........................ 364/550, DIG. 1, 364/424.04, 551.01; 318/490, 434, 471, 473, 254; 361/23, 25, 1; 324/500, 537, 772, 490; 310/156, 217

[56] References Cited

U.S. PATENT DOCUMENTS

| | | | |
|---|---|---|---|
| 4,194,178 | 3/1980 | Dumbeck | 340/201 R |
| 4,258,421 | 3/1981 | Juhasz et al. | 364/424 |
| 4,495,448 | 1/1985 | Dumbeck | 318/54 |
| 4,525,763 | 6/1985 | Hardy et al. | 361/24 |
| 4,575,803 | 3/1986 | Moore | 364/551 |
| 4,659,976 | 4/1987 | Johanson | 318/332 |
| 4,823,067 | 4/1989 | Weber | 318/799 |
| 4,839,830 | 6/1989 | Amey et al. | 364/551.01 |
| 5,019,760 | 5/1991 | Chu et al. | 318/490 |
| 5,189,350 | 2/1993 | Mallett | 318/434 |
| 5,450,321 | 9/1995 | Crane | 364/424.04 |
| 5,473,229 | 12/1995 | Archer et al. | 318/254 |
| 5,554,900 | 9/1996 | Pep, Sr. | |

FOREIGN PATENT DOCUMENTS

| | | |
|---|---|---|
| 2673777 | of 0000 | France. |
| 2681942 | of 0000 | France. |

*Primary Examiner*—James P. Trammell
*Assistant Examiner*—Bryan Bui
*Attorney, Agent, or Firm*—Luedeka, Neely & Graham, P.C.

[57] ABSTRACT

An ac machine monitor, particularly applicable to ac induction motors, provides information for ascertaining the health and condition of the motor. The monitor is self-contained, having its own internal power source, electronics, and sensor suite, and attaches directly to the outer frame of the motor. Sensors disposed within the monitor include a motor frame temperature sensor, flux sensor, vibration sensor, and clock. An ambient temperature sensor enables determination of motor frame temperature relative to ambient. Sensor outputs are processed and analyzed by monitor electronics to determine various life history parameters, including motor speed and load, which are stored in electronic memory. A communications port enables a peripheral device, such as a notebook computer or portable data collector, to communicate with the monitor and download the life history parameters stored in memory. Downloaded data can be further analyzed and statistically compared to trend data at a base computer to ascertain the health and condition of the motor. The monitor electronics are configured to consume very little power so that the internal power source will continue to power the monitor for several years.

32 Claims, 5 Drawing Sheets

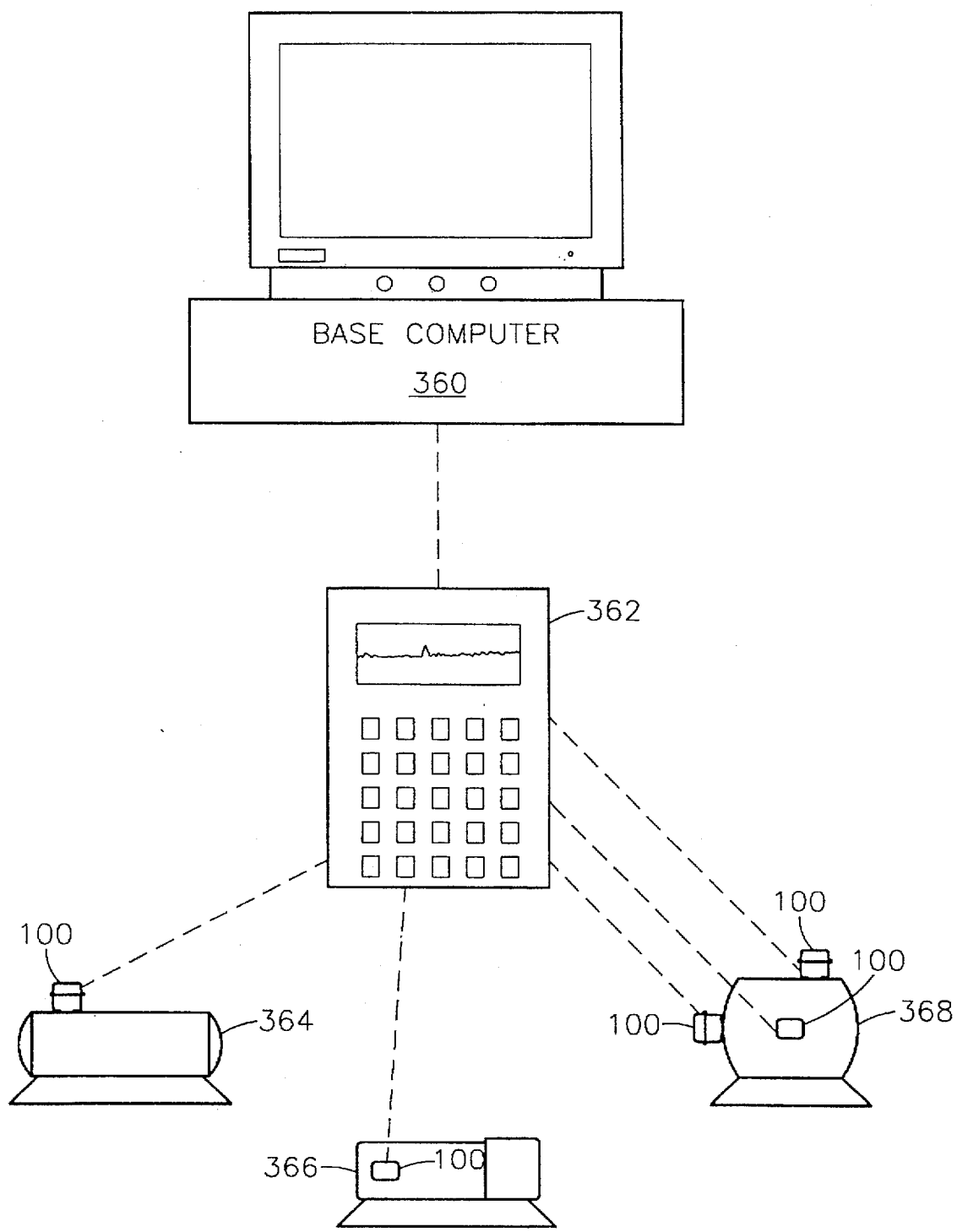
*Fig.* 6

ELECTRIC MOTOR MONITOR

TECHNICAL FIELD

The present invention relates to a method and apparatus for monitoring the condition of electric motors. More particularly, it relates to a self-contained monitor that attaches to an electric motor to monitor and record various operating parameters during the life of the motor so that the condition of the motor is always known.

BACKGROUND

Electric motors, particularly ac induction motors, are employed in many industrial and manufacturing facilities. Among their many applications, ac induction motors are used to provide power to machinery in manufacturing facilities. Downtime caused by a failure of an electric motor reduces productivity and profitability. Electric motors, therefore, are important elements of industrial facilities and their health and condition must be closely observed to prevent motor failures that result in costly unscheduled downtime.

Evaluating the extent of stator wire insulation degradation has long been considered an effective way of determining the condition of an electric motor. As the motor ages, insulation breakdown occurs due to high motor temperature and other operating stresses. When insulation degradation reaches a critical point, the motor windings short circuit, thereby resulting in motor failure.

Attempts have been made in the art to provide electric motor monitoring systems capable of monitoring the condition of the motor. Many of these systems focus on determining the amount of insulation degradation as a way of predicting the remaining useful life of the motor. For example, in U.S. Pat. No. 5,019,760 to Chu et al., a system is disclosed for continuously determining the consumed life of electrical motor winding insulation. Insulation degradation is calculated as a function of insulation thermal properties, insulation temperature, and motor power rating. The temperature of the insulation is measured over a time interval, and the average winding temperature is used to calculate a consumed life of the insulation for that time interval. The consumed life values calculated for each time interval are then summed to determine a total consumed life of the motor.

In U.S. Pat. No. 5,189,350 to Mallett, there is described a monitoring system for an electric motor. A temperature sensor monitors the operating temperature of the motor. A memory is provided for storing the "absolute maximum operating temperature" and a "predetermined maximum permitted operating temperature" of the motor. An indicator is used for indicating the sensed motor temperature as lying within either a safe, hazardous, or dangerous range as determined by comparison of the sensed motor temperature to the stored maximums. A recorder stores the number of times the motor has operated beyond the predetermined maximum permitted operating temperature and the number of times the motor has operated beyond the absolute maximum operating temperature.

In U.S. Pat. No. 4,525,763 to Hardy et al., a system for predicting the remaining useful life of an electric motor is described. Hardy utilizes motor temperature and past history to determine the amount of insulation degradation, which forms the basis of the remaining useful life prediction. The predicted remaining useful life is displayed and may be used to issue a warning or to trip circuit breakers supplying power to the motor when projected life is shorter than predicted life.

While high motor temperature, and resultant insulation degradation can contribute to electric motor failures, it is not the only factor. There are many complex and interrelated operating characteristics of electric motors that affect the health and longevity of the motor. Factors such as motor speed, loading, vibration, and the number of motor starts/stops also affect motor life. However, all known electric motor monitors today are incapable of monitoring these operating characteristics in an efficient, productive manner.

Known prior art devices do not adequately address multiple contributing factors to motor failure, maintenance issues for an electric motor monitoring system itself, enhancing the useability of a monitoring system, or providing a monitoring system that can be applied in a cost effective manner.

What is needed, therefore, is an electric motor monitor capable of sensing and analyzing various stresses experienced by the motor during the life of the motor, including temperature, and storing these stress data as the operation history of the motor. The monitor should be configured to allow stored data to be easily downloaded for archival or further analysis. For purposes of maintainability and affordability, the monitor should be relatively small and self-contained with its own internal power source, and capable of being mounted directly to the motor. Finally, with the monitor mounted directly to the motor, it should be rugged and capable of withstanding the rigors of a harsh industrial environment.

SUMMARY

The present invention provides a monitor that attaches directly to the outer surface of an ac electric motor. The monitor, which senses, analyzes, and stores various motor operating parameters and other data, includes a structural enclosure having an engagement surface formed on the enclosure. The monitor is attached to the motor so that the engagement surface is adjacent the motor. A power source disposed within the enclosure supplies dc electrical power to the monitor. Various sensors are positioned within the enclosure to sense a plurality of motor operating parameters and to produce a plurality of sensor signals corresponding to the sensed parameters. A signal processor receives and processes the sensor signals to produce motor operating parameters based on the sensed parameters. For example, a fast Fourier transform of a vibration signal produced by a vibration sensor can be performed by the signal processor. Motor speed is then determined by the processor from the resultant vibration spectrum, and from speed motor load can be determined. Means, such as electrically erasable programmable memory, are provided for storing the operating parameters within the monitor as the operation history of the motor. The monitor also provides means for outputting at least the stored operation history of the motor.

The signal processor is programmed to produce a number of operating parameters. One such operating parameter is "motor run time". In one embodiment, motor run time is produced by the signal processor based on a flux signal generated by a flux sensor. Another operating parameter produced by the signal processor is "number of motor starts", which may also be determined based on the flux signal. Motor run time can also be determined based on vibration signals produced by a vibration sensor. Other operating parameters that may be produced by the signal processor based on vibration signals include "motor load" and "motor run time during each of a plurality of motor vibration ranges".

Preferably, the monitor includes a motor frame temperature sensor for sensing the temperature of the motor frame. The signal processor includes means for producing an operating parameter corresponding to the maximum motor frame temperature. An ambient temperature sensor may be positioned external to the enclosure to produce an ambient temperature signal. An operating parameter corresponding to motor run time during each of a plurality of motor frame temperatures relative to ambient temperature ranges is produced by the signal processor.

In one embodiment of the invention, means are provided for cyclically storing data generated during a predetermined time period of recency.

The present invention further provides a method of monitoring an ac induction motor that generates magnetic flux, vibration, and temperature. The method includes the step of attaching an electric motor monitor to the outer frame of the motor. The monitor produces a number of signals representing sensed operating parameters of the motor, including a flux signal representing magnetic leakage flux generated by the motor, a vibration signal representing vibrations generated by the motor, and a motor frame temperature signal representing motor frame temperature. The flux, vibration, and motor frame temperature signals are processed by the monitor over time to produce a plurality of life history parameters for the motor. The life history parameters are then stored within the monitor.

As an additional step of the method, the life history parameters may be output to a peripheral device such as a notebook computer or data collector. The collected parameters are then downloaded to a base computer for analysis and archival.

In another preferred embodiment, the invention provides a system for monitoring the condition of one more ac machines. For each ac machine being monitored, the monitoring system includes at least one monitor attached to the machine for sensing and storing a plurality of operating parameters of the machine where the stored parameters correspond to the operation history of the machine. A portable data collector or similar device downloads the stored operation history of each machine.

The data collector can be programmed to analyze the downloaded data on site to provide machine operators with a quick analysis of the operating condition of the machine. Alternatively, the downloaded data may be provided to a base computer for analysis and archival.

BRIEF DESCRIPTION OF THE DRAWINGS

The preferred embodiments of the invention will now be described in further detail with reference to the drawings wherein like reference characters designate like or similar elements throughout the several drawings as follows:

FIG. 6 is a diagrammatic drawing illustrating a monitoring system that employs a portable data collector to periodically download data stored by various monitors and transfer the downloaded data to a base computer for processing and analysis.

DETAILED DESCRIPTION OF PREFERRED EMBODIMENTS

Figure 1:
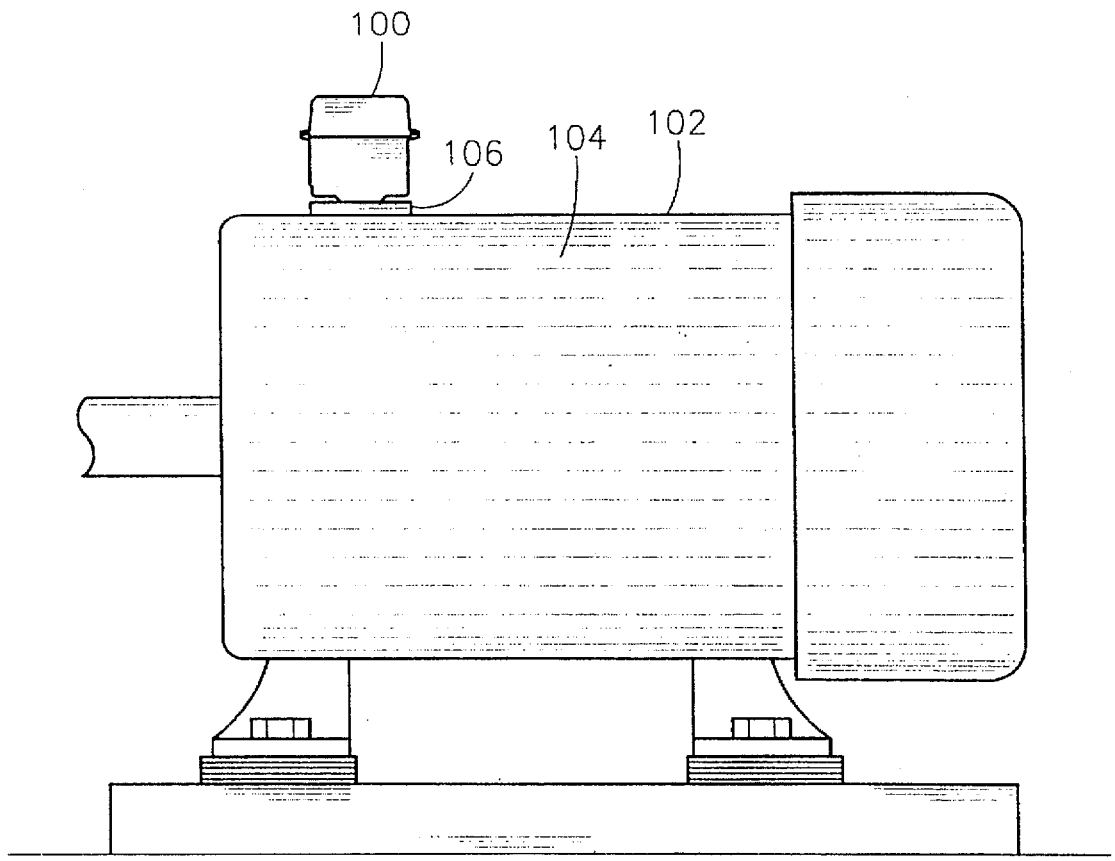
FIG. 1 is a side view of an ac induction motor with a monitor of the present invention attached to the motor by means of a mounting plate.

In accordance with a preferred embodiment of the present invention shown in FIG. 1, a motor monitor 100 capable of sensing, analyzing, storing, and outputting various motor operating data is attached externally to the frame 104 of a large industrial electrical machine, such as an ac induction motor 102. Alternately, the monitor 100 may be attached to an ac generator for sensing and recording various life history parameters of the generator. The monitor 100, which is fully self-contained in sensors, data acquisition, and power, is small in comparison to the size of the motor 102 and mounted so as not to interfere with the operation of the motor 102. Although FIG. 1 illustrates a monitor 100 mounted at a particular location on the motor frame 104, it will be understood that the monitor 100 may be mounted at any location along the motor frame 104 where motor parameters, such as temperature, vibration, and flux, may be sensed.

Figure 2:
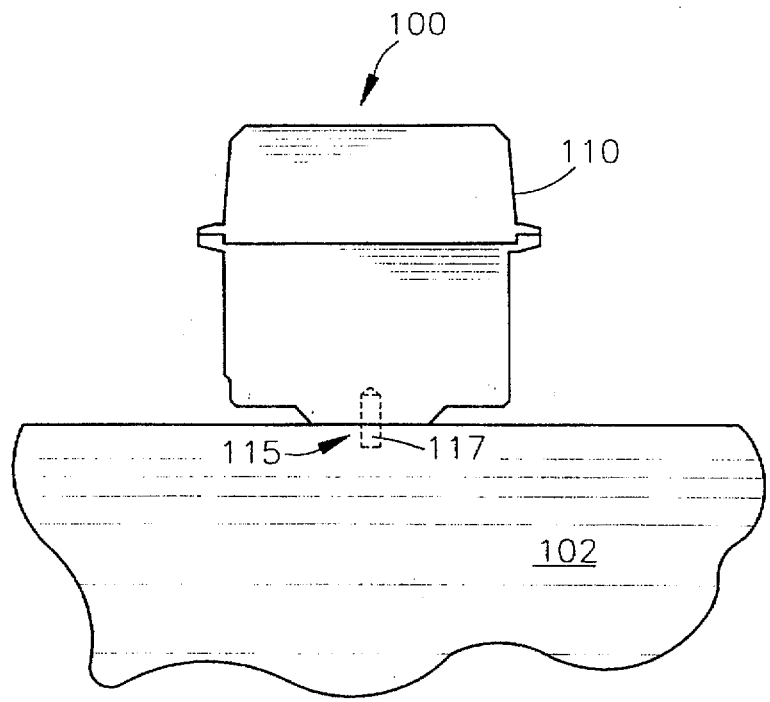
FIG. 2 is a sectional view of an electric motor monitor attached to an electric motor by means of a bolt threaded into the lifting eye bolt hole of the motor.

In order to provide consistent, reliable motor operating data, the monitor 100 should be capable of withstanding the environmental conditions typically experienced by an electric motor 102, including mechanical shock, temperature, and contamination from such materials as oil and water. As shown in FIG. 2, the monitor 100 consists of a ruggedized housing 110 capable of withstanding the typically harsh environments of industrial facilities. Electronics and sensors within the monitor 100 are sealed and protected by the housing 110 so that the monitor 100 may be mounted in exterior and wet environments.

Figure 3:
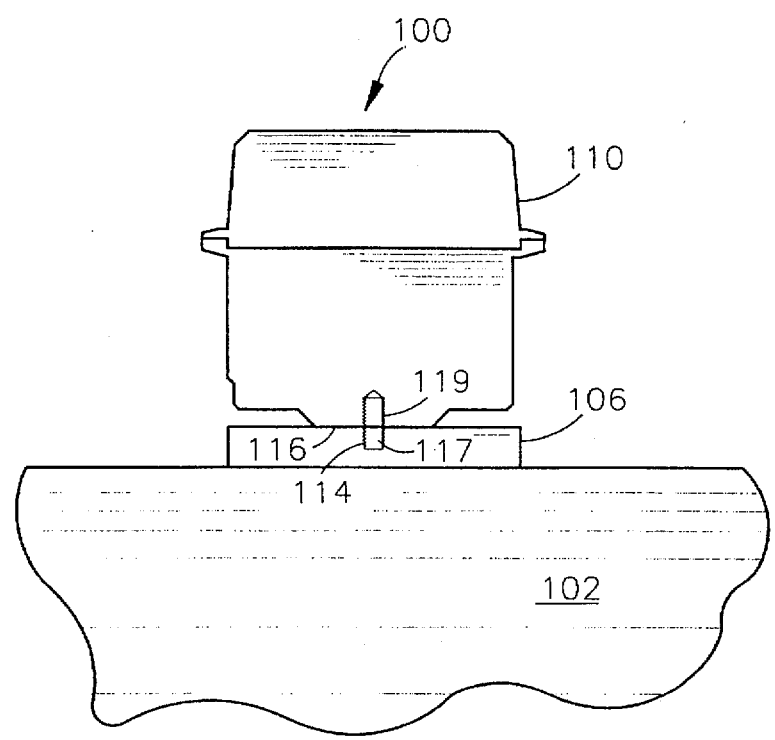
FIG. 3 is a sectional view of the motor monitor and mounting plate of FIG. 1.

Although the monitor 100 may be attached to the motor 102 by any suitable attachment means, including bolts, screws, rivets, quick release fasteners, welding, adhesives, and magnets, a preferred means of attaching the monitor 100 to the motor 102 is shown in FIG. 1. A mounting plate 106 is secured to the motor frame 104 by bolts (not shown). Alternatively, the mounting plate 106 is attached to the frame 104 by an epoxy adhesive. As FIG. 3 illustrates, the mounting plate 106 includes a threaded recess 114 into which a threaded stud 117 is positioned. The stud 117 is of sufficient length to protrude above the plate 106 as shown. At the base of the monitor 100 is an engagement surface 116 that includes a threaded recess 119 sized to receive the stud 117. After mounting plate 106 is attached to the motor 102 and the stud 117 positioned within recess 114, the monitor 100 is then threaded onto that portion of stud 117 that protrudes above the mounting plate 106 so that the engagement surface 116 contacts the mounting plate 106.

Referring again to FIG. 2, an alternate means of attaching the monitor 100 to the motor 102 is illustrated. The mounting plate 106 is eliminated in FIG. 2 and stud 117 is instead threaded into an existing motor lifting eye bolt hole, shown generally at 115. For the attachment methods illustrated in FIGS. 2 and 3, attachment of the monitor 100 to the motor 102 can be accomplished by hand. No tools are needed.

The monitor 100 may be conceptually viewed as a device that provides a function somewhat similar to the function provided by the odometer of an automobile. An automobile odometer provides the operator with information relating to how many total miles the vehicle has been driven. The mileage indicated by the odometer is used by the operator, and others, as a single measure of the general health and condition of the automobile. Preventive maintenance, component life, and even the worth of an automobile are usually established by this single parameter (i.e., mileage). Because of the complexity and interrelationship of factors that effect the condition of electric motors, the health of an electric motor generally cannot be determined by a single parameter. For example, the following factors have been determined to affect the life of an electric motor:

1. Total run time (in hours);
2. Run time at various motor loading conditions;
3. Motor temperature;
4. Ambient temperature;
5. Number of starts and stops;
6. Motor vibration;
7. Balance and alignment of the motor;
8. Temperature history of the windings; and
9. Efficiency of the motor.

The monitor 100 of the present invention senses, collects, analyzes, and stores information useful for ascertaining the health and condition of electric motors based on these factors. Although it is preferable to incorporate within the monitor 100 the capability to analyze sensor data, such as by fast Fourier transform (FFT), it is not required. If desired, the monitor 100 may be used simply as a device that senses and stores various operating characteristics with little or no analysis of the data performed within the monitor 100 itself. The stored sensor data could be downloaded to a base computer for analysis and archival.

Figure 4:
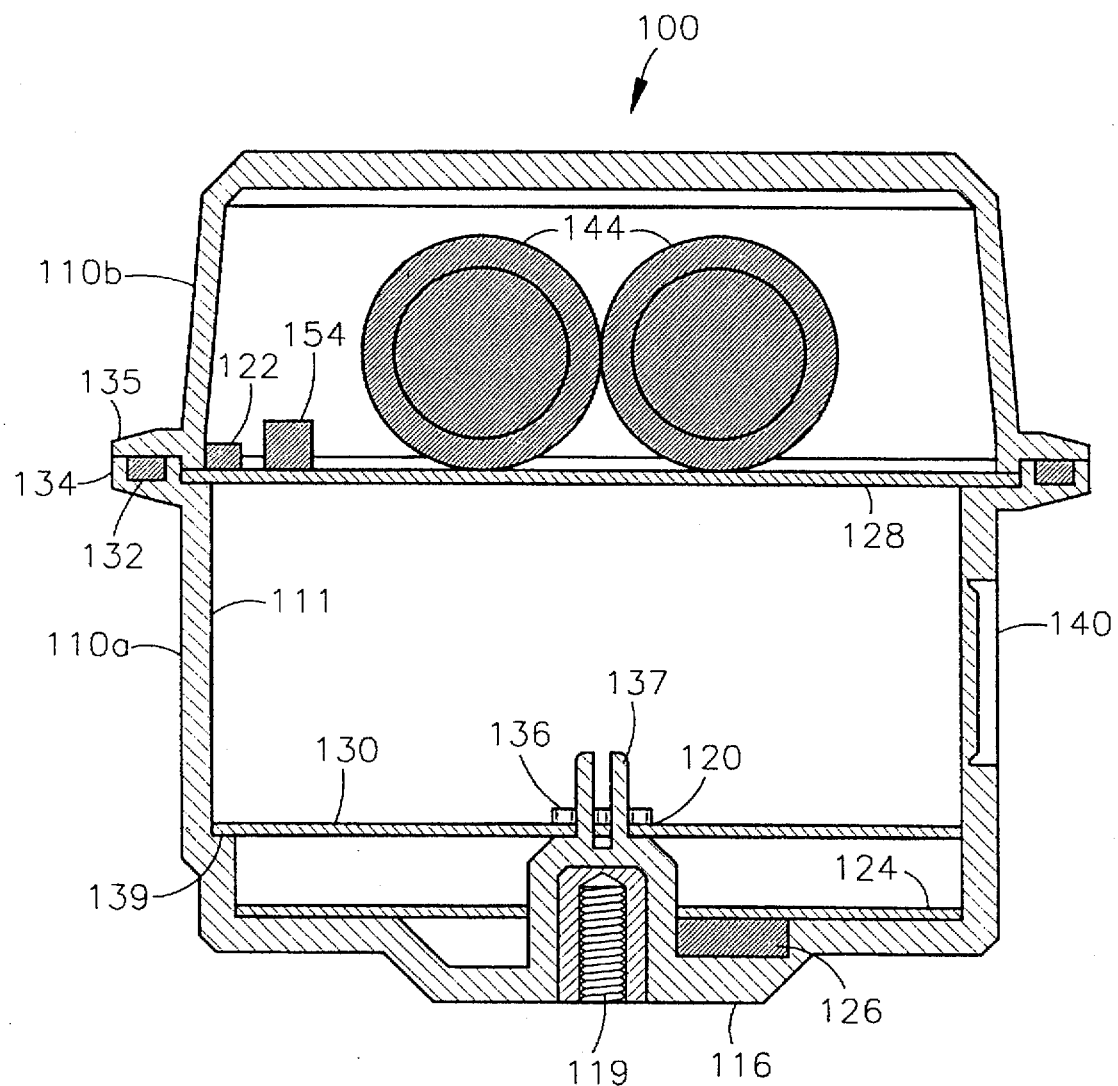
FIG. 4 is a cross-sectional view of the monitor of FIGS. 1 and 2.

As illustrated in the cross-sectional view of FIG. 4, the housing 110 of the monitor consists of a bucket 110a that is covered by lid 110b. At the top of the bucket 110a is an annular flange 134 which joins with a corresponding annular flange 135 formed at the bottom of the lid 110b. The bucket 110a and lid 110b are secured to each other by one or more clamps (not shown) which hold flanges 134, 135 in compression. Set within a channel formed in flange 134 is a rubber O-ring 132 to prevent intrusion of moisture and other contaminants at the interface of flanges 134, 135.

Figure 5:
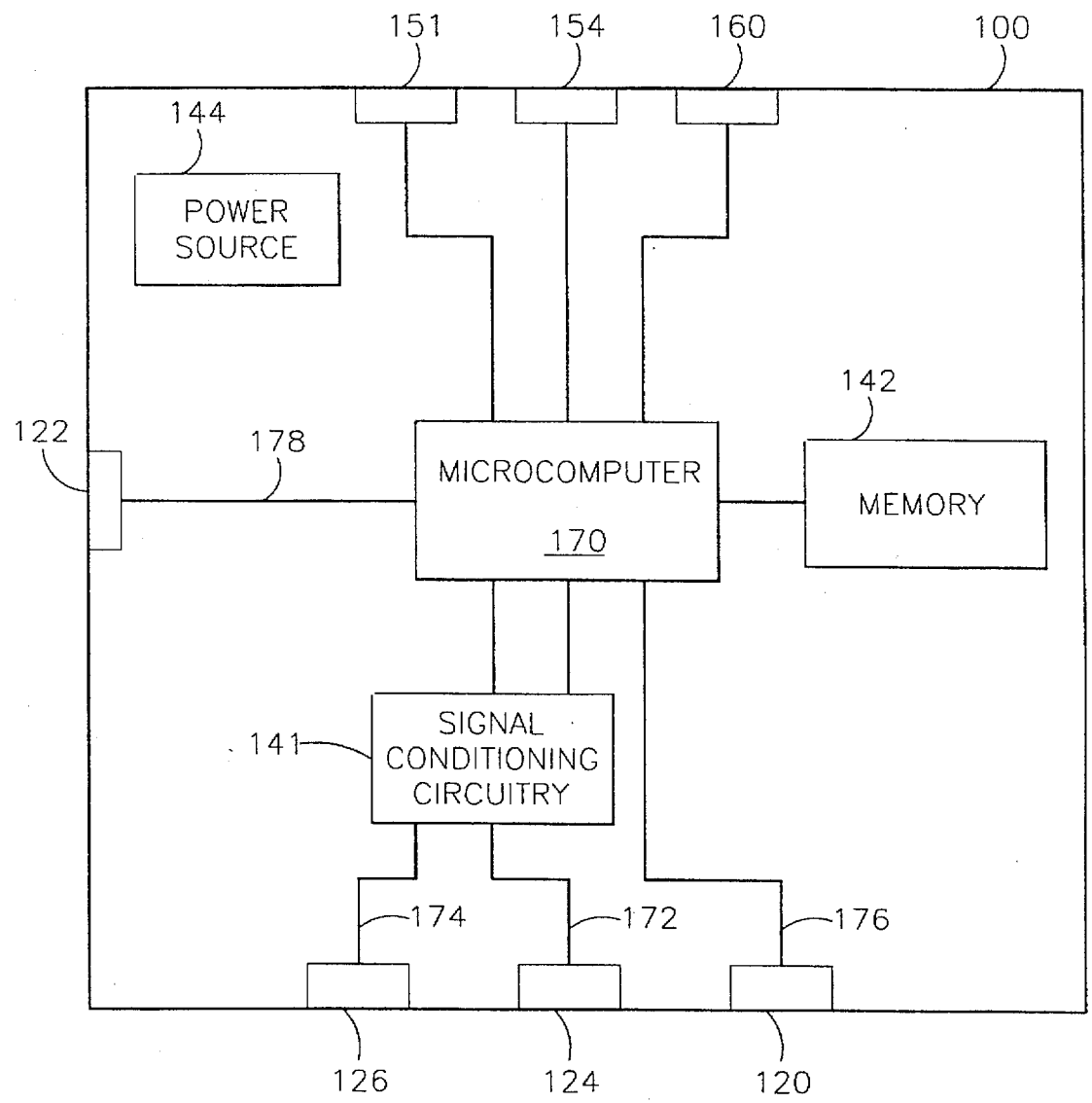
FIG. 5 is a functional block diagram of a preferred embodiment of monitor electronics and sensors.

As can be seen in FIG. 4, the engagement surface 116 extends beyond the base of the bucket 110a to elevate the monitor 100 and help reduce thermal conductivity between the motor 102 and monitor 100. As FIG. 4 illustrates, and with further reference to the functional block diagram of FIG. 5, sensors within the monitor 100 are preferably mounted at or near the engagement surface 116 at the base of the monitor 100. When the monitor 100 is threaded into the eye bolt hole 115 (FIG. 2) or mounting plate 106 (FIGS. 1 and 3), the sensors establish contact with the motor frame 104 through the engagement surface 116 so that temperature, flux, and vibrations produced by the motor 102 can be detected more readily.

Sensors positioned at the base of the monitor 100 for sensing various parameters of the motor 102 during operation include a motor frame temperature sensor 120, a magnetic flux sensor 124 for sensing motor flux, and a radial vibration transducer 126 for sensing motor vibrations generated by the motor 102 and transmitted through the motor frame 104. In addition to the sensors at the base of the monitor 100, an ambient temperature sensor 122 is mounted on top of a removable shelf 128 that is held in compression between the bucket 110a and lid 110b as shown. In a preferred embodiment, flux sensor 124 is a specially designed board of substantially circular dimension adhesively secured to the bottom of the bucket 110a. A metal trace deposited onto the board in a spiral pattern serves as the flux sensing element.

Outputs from sensors 122, 124, and 126 are electrically connected to an electronics board 130 where the sensor outputs are processed and stored as motor operating parameters. Two D cell batteries 144, which provide a source of dc electrical power for the monitor 100, are secured to shelf 128. Equipment that is secured to shelf 128, including batteries 144, ambient temperature sensor 122, and infrared communications port 154, are electrically connected to the electronics board 130 via a ribbon cable. Motor frame temperature sensor 120 is attached directly to the electronics board 130.

As shown in FIG. 4, the electronics board 130 is positioned immediately above the flux sensor board 124. A press nut 136 and associated hold down fitting 137 secures the electronics board 130 in place.

Additional provisions are made for the attachment of a remote temperature sensor (not shown) to the electronics board 130 for measuring, for example, internal stator temperature. Formed in the wall of the bucket 110a is a knockout section 140. To connect a remote temperature sensor to the electronics board 130, the knockout section 140 is removed and a conduit fitting is attached in its place. Electrical connection between the remote sensor and board 130 is then provided via one or more electrical conductors routed through a conduit attached to the conduit fitting. The remote temperature sensor, when used, enables the user to measure internal stator temperature so that stator temperature increase can be determined from trend data.

Outputs from all sensors are processed and stored by electronics contained on the electronics board 130. As illustrated in the functional block diagram of FIG. 5, the electronics include analog signal conditioning circuitry 141 for amplifying and frequency filtering flux and vibration signals, a microcomputer 170 programmed to control the processing and storage of sensor data, and a memory 142 for storing sensor data. In an alternate embodiment, the functions provided by the signal conditioning circuitry 141 are performed by the microcomputer 170. An electrical power source 144 provides all electrical power for the monitor 100. It will be understood that, for purposes of simplifying the block diagram illustration of FIG. 5, all connections to the power source 144 are omitted.

In operation, flux board 124 senses magnetic flux produced by the motor 102 and outputs an electrical signal corresponding to sensed flux on line 172. Flux board 124 measures motor leakage flux much like an antenna. Significant information about the motor's condition can be determined from the flux signal, including running or stopped status, motor speed and load (computed from slip), and startup acceleration time. In addition, by performing a high resolution fast Fourier transform (FFT) of the flux signal, one can determine voltage phase imbalance, stator turn to turn shorts, and rotor bar condition.

Motor life factors (including motor run time, motor load and cumulative run time in various load ranges, motor starts, and the time required for a starting motor to reach operating speed) are computed from the sensor signals. In addition, several motor electrical condition indicators are measured from a high resolution flux spectrum. Voltage phase imbalance, stator condition, and rotor condition are measured as relative, trendable parameters. By obtaining a measured current spectrum for the motor at full load, a calibration and severity indication of these relative values can be determined.

Motor vibrations sensed by vibration transducer 126 are converted into a corresponding electrical signal and output on line 174. From this sensor, the monitor 100 can determine the following parameters:

1. Overall vibration;
2. Subharmonics;
3. 1X;
4. 2X;
5. High frequency in acceleration units;
6. 3X–8X synchronous energy;
7. 1X–8X nonsynchronous energy;
8. >8X synchronous energy; and
9. >8X nonsynchronous energy.

From this set of vibration parameters, mechanical faults are detected including imbalance, looseness, bearing degradation, oil instability in sleeve bearings, resonances, and others. The cumulative time the motor spends in each of three general vibration ranges (low, medium, and high) is also tracked.

The frame temperature sensor 120 outputs an electrical signal on line 176 corresponding to the temperature of the motor frame 104, and ambient temperature sensor 122 outputs an electrical signal on line 178 corresponding to ambient temperature. The difference between the two temperatures is the motor heating. The microcomputer 170 receives each of the sensor signals on lines 172–178, processes and analyzes the signals, and stores the processed signals. The monitor 100 tracks ambient temperature, motor frame temperature, and motor heating as trendable parameters, as well as the cumulative amount of time motor heat resides in three temperature ranges (low, medium, and high). Temperature profile investigations of a motor's external frame 104 shows the hottest points on a motor are midway between front and back on the side or top of the motor. Typically, open frame motors show a maximum external temperature range between 35° C. and 50° C. Totally enclosed motors typically range between 40° C. and 60° C. These temperature ranges are considered normal.

A general rule of temperature effect on motor reliability is that a long term 10° C. rise in stator temperature cuts a motor's life in half. There are many factors which can cause a motor to run hot, including:

1. Over or under voltage;
2. Frequency deviation from 60 Hz;
3. Voltage imbalance;
4. Harmonic content;
5. Altitude derating;
6. High ambient temperature (>40° C.);
7. Dirty or blocked cooling passages; and
8. Excessive load.

All of these factors result in an increase in motor heating and a significant reduction in motor life.

Data is first stored within the microcomputer's internal random access memory (RAM). Data stored in RAM is then periodically transferred to an external memory device 142, such as an electrically erasable programmable read only memory (EEPROM), for longer term storage.

From the sensor outputs, many different types and formats of motor operating parameters and information can be measured and/or calculated. For example, the cumulative run time of the motor 102 can be determined and stored for the life of the motor 102. In addition, if the user wanted to know the cumulative run time of the motor 102 for the past 30 month period, that information can be determined and stored as well. Table 1 illustrates the types and formats of parameters that are determined and stored in a preferred embodiment of the invention, where the leftmost column identifies various parameters that are measured, the middle column identifies the measurement period(s) for each parameter, and the rightmost column identifies the interval at which parametric measurements are acquired.

TABLE 1

| PARAMETER | MEASUREMENT | ACQUISITION INTERVAL |
|---|---|---|
| Motor Life Parameters | | |
| 1. Run time | 180 days, 60 months, life | 1 minute |
| 2. Starts | 180 days, 60 months, life | 1 minute |
| 3. Starting time | 180 days, 60 months, life | 1 minute |
| 4. Light load time 0–75% | 180 days, 60 months, life | 1 minute |
| 5. Rated load time 76–105% | 180 days, 60 months, life | 1 minute |
| 6. High load time >106% | 180 days, 60 months, life | 1 minute |
| 7. Low motor heating time | 180 days, 60 months, life | 1 minute |
| 8. Mid motor heating time | 180 days, 60 months, life | 1 minute |
| 9. High motor heating time | 180 days, 60 months, life | 1 minute |
| 10. Low vibration time | 180 days, 60 months, life | 1 minute |
| 11. Mid vibration time | 180 days, 60 months, life | 1 minute |
| 12. High vibration time | 180 days, 60 months, life | 1 minute |
| Trend Parameters | | |
| 13. Motor frame temperature | maximum, average | 1 minute |
| 14. Ambient temperature | maximum, average | 1 minute |
| 15. Motor heating (Frame-ambient) | maximum, average | 1 minute |
| 16. Motor load | maximum, average | 1 minute |
| 17. Voltage phase imbalance | maximum, average | 1 hour |
| 18. Stator condition | maximum, average | 1 hour |
| 19. Rotor condition | maximum, average | 1 hour |
| 20. Subharmonic vibration | maximum, average | 1 hour |
| 21. 1X vibration | maximum, average | 1 hour |
| 22. 2X vibration | maximum, average | 1 hour |
| 23. Harmonic vibration 3X–8X | maximum, average | 1 hour |
| 24. Harmonic vibration >8X | maximum, average | 1 hour |
| 25. Non-harmonic vibration 1X–8X | maximum, average | 1 hour |
| 26. Non-harmonic vibration >8X | maximum, average | 1 hour |
| 27. HFD | maximum, average | 1 hour |
| 28. Overall vibration | maximum, average | 1 hour |
| Maintenance Log Parameters | | |
| 29. Lubrication date/time | | As performed |
| 30. Alignment date/time | | As performed |
| 31. Bearing change date/time | | As performed |
| 32. Flux spectrum 1600 lines | Last 12 months (one/month) | 1 hour |
| 33. Vibration spectrum, 400 lines, 300 Hz | Last 52 weeks (one/week) | 1 hour |
| 34. Vibration spectrum, 800 lines, 2500 Hz | Last 12 months (one/month) | 1 hour |
| For Variable Frequency Motors | | |
| 35. RPM cumulative time <50% max rating | 180 days, 60 months, life | 1 minute |
| 36. RPM cumulative time 50–100% max rating | 180 days, 60 months, life | 1 minute |
| 37. RPM cumulative time >100% max rating | 180 days, 60 months, life | 1 minute |
| 38. RPM | maximum, average | 1 minute |

Table 1 is divided into four categories of parameters—motor life, trend, maintenance, and variable frequency motor parameters. Each parameter is measured frequently and stored in a daily and monthly buffer. The maximum and average levels for certain parameters are stored daily and kept for 180 days in a circular buffer. Each average and maximum parameter value is stored monthly in the EEPROM 142 and saved for 60 months (5 years). Some parameters are stored as the cumulative value over defined intervals, including intervals of 180 days, 60 months, and lifetime.

For example, for the motor life parameters (parameters 1–12), the cumulative value of each parameter is stored for the last 180 days, the last 60 months, and life. For trend parameters (parameters 13–28), each parameter is stored once per day for the last 180 day period and once per month for the last 60 month period.

In the circular data buffers, as new data is acquired, the oldest data in the cycle is deleted. For example, in the circular buffer for "motor frame temperature", when the data for the 61st month is acquired, it overwrites the data for the first month. Therefore, to maintain a complete historical record of this parameter, data relating to motor frame temperature should be downloaded from the monitor 100 and placed in long term electronic storage at least once every 60 months.

As Table 1 indicates, information pertaining to motor maintenance may be input and stored in the monitor 100. A record of all maintenance activity on the motor 102 can be entered through an external device, such as a CSI™ 2120 data collector, and stored in the monitor 100. Maintenance information includes the time and date of lubrication, machine alignment, and bearing replacements.

Data and information is transmitted to and from the monitor 100 through a communications port 154 (FIGS. 4 and 5), which is preferably a serial infrared (IR) data link. The lid 110b is fabricated from an IR transmissible material, such as a polycarbonate material, so that communications port 154 can be protected within the monitor's housing 110. Communications port 154 provides an interface for communicating with an external device, such as a portable data collector or notebook computer, via infrared data link to enable the history information to be downloaded. The portable data collector or notebook computer may also be used to program, or download programs to, the monitor 100. For the parameters given in Table 1, data would need to be downloaded at least every 180 days to avoid loss of any data. In other applications, the circular data buffers may be designed with longer or shorter circular lives. The downloaded information can be further analyzed to provide an indication of the remaining useful life of the motor 102 and to diagnose problems.

At least two options are available for collecting stored data. In one option, a portable data collector is used as a data gatherer only, with no data display capability. The data is simply moved from the monitor 100 to a base computer for analysis and archival. Another option for data collection utilizes a full Windows™ compatible pad computer running the necessary data analysis software. The pad computer should be rugged enough to analyze and display motor parametric data in the field.

In a preferred embodiment, all electrical power for the monitor 100 is provided by one or more dc batteries 144, such as two replaceable, D cell, Alkaline batteries 144 as previously discussed with respect to FIG. 4. Power consumption is kept to a minimum in the interest of prolonging battery life to at least two years. Microcomputer 170, which in a preferred embodiment is an 8-bit microcomputer manufactured by Toshiba, minimizes power consumption by employing a power saving sleep mode where the microcomputer 170 remains idle, or sleeps most of the time. The microcomputer 170, which includes a clock for maintaining time and date and for measuring elapsed time for certain parameters, awakes periodically, such as every 5 seconds, and checks the motor ON/OFF status. If the motor 102 is ON, the monitor 100 checks the overall amplitude measurements (load, temperature, and vibration) every 2 minutes, all measurements derived from FFT calculations once per hour, and starts per day are counted. If the motor 102 is OFF, no data is stored and the monitor 100 is set to capture the acceleration time upon start-up.

Other sources of electrical power suitable for use within the monitor 100 are available. For example, the D cell Alkaline batteries of the preferred embodiment could be replaced with a Peltier device. This type of device includes a material which, when heated on one side and cooled on the other, produces electrical power. The larger the temperature differential, the more power that the device is able to produce. The Peltier device would take advantage of motor heat to elevate the temperature of the hot side of the device, while ambient cooling would be used to reduce the temperature of the cold side. As another alternate source of power, a 120 volt power line can be connected to the monitor 100.

During operation of an electric motor 102, heat generated by the motor is typically transferred by the motor frame 104 to the ambient air, creating a heat blanket that surrounds the motor frame 104. A heat blanket may also result from external factors, such as heating induced by absorption of sunlight. Under certain conditions with some motors, this heat blanket can be large enough to adversely effect the accuracy of the ambient temperature sensor 122 and significantly reduce battery life. Heat generated by the motor 102 and external factors is also conducted from the frame 104 and surrounding ambient air to the monitor 100.

To reduce adverse effects of elevated temperature on temperature sensitive equipment such as the ambient temperature sensor 122 and batteries 144, such equipment is preferably located on shelf 128 shown in FIG. 4. As seen in FIG. 4, shelf 128 is elevated by the bucket 110a so that equipment located on the shelf 128 is largely if not totally removed from the motor's heat blanket. The bucket 110a itself, being fabricated from a low thermally conductive material, also functions in a lesser capacity to shield convective heat from the ambient temperature sensor 122 and batteries 144.

As discussed above, life history parameters are stored in memory 142 where they can be accessed and downloaded via communications port 154. To determine these parameters, microcomputer 170 utilizes signals generated by the sensors 120–126. Some of the sensor signals are utilized by the microcomputer 170 with little or no conditioning of the signals, while other sensor signals receive some amount of conditioning by the signal conditioning circuitry 141, including amplification and frequency filtering, before microcomputer 170 uses them. For example, to determine "run time", the output of flux board 124 may be used directly by microcomputer 170 as an indication that the motor 102 is operating. To ensure the flux signal has sufficient strength, it is first amplified and frequency filtered as needed by the signal conditioning circuitry 141 before it is received by the microcomputer 170. The microcomputer's internal clock is used to maintain a count of the total hours during which magnetic leakage flux is being generated by the motor 102. In this manner, the life history parameter of "run time" shown in Table 1 is determined. Alternatively, the outputs of frame temperature sensor 120 and accelerometer 126 may be utilized as indications of when the motor 102 is operating.

As other examples of life history parameters that are determined directly from sensor outputs, consider the parameter of "maximum motor frame temperature". To determine this parameter, microcomputer 170 compares the current frame temperature sensor output on line 176 to the previous maximum frame temperature. The stored maximum frame temperature is replaced by the current frame temperature when the current frame temperature exceeds the stored maximum. Similarly, the parameter labeled "starts" is determined directly from measured flux, or if preferred, it may be determined by monitoring temperature and vibration. When both exceed a selected threshold, a "running" condition is assumed. When either falls below its threshold, a "stopped" condition is assumed.

To determine the three "motor heating time" parameters, microcomputer 170 subtracts ambient temperature from the frame temperature to arrive at a motor heating temperature. Total motor run time at each of the low, mid, and high heating levels identified in Table 1 is then determined from the microcomputer's internal clock.

The analog output of flux board 124 is received from line 172 and amplified before being used by the microcomputer 170. As previously stated, microcomputer 170 uses a signal representative of magnetic flux produced by the motor 102 to ascertain when the motor 102 is operating. The analog output of vibration transducer 126, which represents vibration in the acceleration domain, is received by the signal conditioning circuitry 141 from line 174 where the vibration signal is preferably amplified, frequency filtered, and integrated. The conditioned vibration signal is then provided to microcomputer 170 for storage and/or analysis. Alternatively, integration of the vibration signal may be performed by the microcomputer 170.

Following an analog-to-digital conversion, the velocity domain vibration signal is used by the microcomputer 170 to determine the various vibration parameters identified in Table 1. Preferably, the "maximum vibration" is the maximum vibration measured in velocity units, but alternately, velocity may be integrated to obtain vibration measured in displacement units and the maximum displacement is, in this alternate embodiment, stored as the "maximum vibration". Motor speed is determined from a high resolution FFT of the digitized vibration signal. Preferred methods of determining motor speed from vibration spectral data are disclosed in pending U.S. patent application Ser. No. 08/644,176, filed May 10, 1996, and entitled METHOD FOR DETERMINING ROTATIONAL SPEED FROM MACHINE VIBRATION DATA, the entire contents of which are expressly incorporated herein by reference. The difference between actual speed and synchronous speed at no load is used to determine motor load.

During initial installation and setup of the monitor 100, the monitor 100 is setup for the particular motor 102 on which it is installed. During this installation mode, a peripheral device such as a notebook computer or portable data collector is connected to the monitor 100 via the communications port 154 for programming, or training. Various settings and adjustments are made to the monitor 100 during setup, including full load speed, number of poles, motor identification, and others.

Once installation and training are completed, operation of the monitor 100 is completely self-contained and maintenance-free. As previously described, the monitor's internal battery 144 and electronics are configured to operate for at least two years before battery power is depleted. Data stored in the memory 142 should be periodically downloaded, at least once every six months, and analyzed to determine the health and operating condition of the motor 102. When life-extending maintenance is performed on the motor 102, that maintenance information should be input to the monitor 100.

In a typical industrial facility, tens or even hundreds of electrical machines may exist. As FIG. 6 illustrates, the present invention provides plant personnel with a convenient system for monitoring each machine. Illustrated in FIG. 6 are three electric motors 364, 366, and 368 onto which monitors 100 have been attached. A portable data collector 362, such as a CSI™ 2120 data collector, is used to periodically download data stored in each of the monitors' memory 142. After all downloading of data is completed, the collected data is transferred to a base computer 360 for analysis and archival. Alternatively, the data collector 362 may be programmed to analyze the downloaded data on site to provide a quick determination of the operating condition of a particular motor. As described previously herein, a further function of the data collector 362 is to program, or download programs from, the monitors 100.

It is contemplated, and will be apparent to those skilled in the art from the foregoing specification, drawings, and examples that modifications and/or changes may be made in the embodiments of the invention. Accordingly, it is expressly intended that the foregoing are illustrative of preferred embodiments only, not limiting thereto, and that the true spirit and scope of the present invention be determined by reference to the appended claims.

What is claimed is:

1. A monitor that attaches to an ac electric motor, said monitor comprising:

a structural enclosure;

an engagement surface formed on said enclosure;

means for attaching said enclosure to the motor so that said engagement surface is adjacent the motor;

a power source disposed in said enclosure for supplying dc electrical power to the monitor;

sensors disposed in said enclosure for sensing a plurality of sensed parameters of the motor and producing a plurality of sensor signals corresponding to the sensed parameters;

a signal processor disposed in said enclosure for receiving and processing the sensor signals to produce operating parameters of the motor based on the sensed parameters;

means for storing the operating parameters, said stored operating parameters corresponding to the operation history of the motor; and means for outputting at least the stored operation history of the motor.

2. A monitor according to claim 1, wherein said signal processor includes means for performing a fast Fourier transform of one or more of said sensor signals, at least one of said operating parameters being produced from a fast Fourier transform of a sensor signal.

3. A monitor according to claim 1, wherein said signal processor further comprises means for producing an operating parameter corresponding to motor run time.

4. A monitor according to claim 3, said sensors comprising a flux sensor for sensing magnetic flux generated by the motor, wherein the parameter of motor run time is produced by the signal processor based on said flux signal.

5. A monitor according to claim 1, wherein said signal processor further comprises means for producing an operating parameter corresponding to the total number of motor starts.

6. A monitor according to claim 5, said sensors further comprising a flux sensor for sensing magnetic flux generated by the motor, wherein the parameter of total number of motor starts is produced by the signal processor based on said flux signal.

7. A monitor according to claim 1, wherein said signal processor further comprises means for producing an operating parameter corresponding to motor speed.

8. A monitor according to claim 7, said sensors further comprising a vibration sensor for sensing mechanical vibrations generated by the motor and transmitted by the engagement surface, producing a vibration signal representing motor vibrations, wherein the parameter of motor speed is produced by the signal processor based on said vibration signal.

9. A monitor according to claim 7, wherein said signal processor further comprises means for determining motor load based on motor speed.

10. A monitor according to claim 9, wherein said signal processor further comprises means for producing operating parameters corresponding to motor run time in each of a plurality of motor load ranges.

11. A monitor according to claim 1, wherein said signal processor further comprises means for producing operating parameters corresponding to motor run time in each of a plurality of motor vibration ranges.

12. A monitor according to claim 11, said sensors further comprising a vibration sensor for sensing mechanical vibrations generated by the motor and transmitted by the engagement surface, producing a vibration signal representing motor vibrations, wherein the parameters of motor run time during each of a plurality of motor vibration ranges are produced by the signal processor based on said vibration signal.

13. A monitor according to claim 1, wherein said sensors further comprise a motor frame temperature sensor for sensing the temperature of the motor frame, producing a motor frame temperature signal representing motor frame temperature.

14. A monitor according to claim 13, wherein said signal processor further comprises means for producing operating parameters corresponding to motor run time in each of a plurality of motor frame temperature ranges based on said motor frame temperature signal.

15. A monitor according to claim 13, further comprising an ambient temperature sensor positioned external to said enclosure, producing an ambient temperature signal representing ambient temperature.

16. A monitor according to claim 15, wherein said signal processor further comprises means for producing an operating parameter corresponding to motor run time during each of a plurality of motor frame temperatures relative to ambient temperature ranges based on said motor frame temperature and ambient temperature signals.

17. A monitor according to claim 1, wherein said means for storing data comprises means for cyclically storing data generated during a predetermined time period of recency.

18. A monitor according to claim 1, wherein said means for storing data comprises an electrically erasable programmable read only memory.

19. A monitor that attaches to and produces an operation history of an ac induction motor, said monitor comprising:

a structural enclosure;

a dc power source disposed in said enclosure;

a flux sensor disposed in said enclosure for sensing magnetic flux generated by the motor, producing a flux signal representing flux;

a vibration sensor disposed in said enclosure for sensing vibrations generated by the motor, producing a vibration signal representing motor vibrations;

a motor frame temperature sensor disposed in said enclosure for sensing the temperature of the motor, producing a motor frame temperature signal representing motor frame temperature;

an ambient temperature sensor positioned external to said enclosure for sensing ambient temperature and producing an ambient temperature signal representing ambient temperature;

a signal processor disposed in said enclosure for receiving and processing the flux, vibration, motor frame temperature, and ambient temperature signals to produce a plurality of motor operating parameters;

means for storing the operating parameters, said stored operating parameters corresponding to the operation history of the motor; and means for outputting at least the stored operating history of the motor.

20. A method of monitoring an ac induction motor which generates magnetic flux, vibration, and temperature, comprising the steps of:

attaching an electric motor monitor to the outer frame of an ac induction motor;

producing a flux signal with said monitor representing magnetic flux generated by the motor;

producing a vibration signal with said monitor representing vibrations generated by the motor;

producing a motor frame temperature signal with said monitor representing motor frame temperature;

processing the flux, vibration, and motor frame temperature signals with said monitor over time to determine a plurality of life history parameters for the motor; and storing said life history parameters in said monitor.

21. The method of claim 20, wherein said processing step includes the step of performing a fast Fourier transform on at least one of said flux and vibration signals, at least one of said plurality of life history parameters being determined from a fast Fourier transform of a sensor signal.

22. The method of claim 20, further comprising the step of outputting said life history parameters to a peripheral device.

23. The method of claim 20, wherein said processing step comprises the step of determining motor run time based on said flux signal.

24. The method of claim 20, wherein said processing step comprises the step of determining the number of motor starts based on said flux signal.

25. The method of claim 20, wherein said processing step comprises the step of determining motor run time during each of a plurality of motor vibration ranges based on said vibration signal.

26. The method of claim 20, wherein said processing step comprises the step of determining motor run time in each of a plurality of motor frame temperature ranges.

27. The method of claim 20, further comprising the step of producing an ambient temperature signal with said monitor representing ambient temperature.

28. The method of claim 27, wherein said processing step comprises the steps of:

calculating motor frame temperature relative to ambient temperature based on said motor frame temperature and ambient temperature signals; and determining motor run time during each of a plurality of motor frame-ambient temperature ranges.

29. The method of claim 20, wherein said processing step comprises the step of determining motor speed based on said vibration signal.

30. The method of claim 20, wherein said processing step comprises the steps of:

determining motor speed based on said vibration signal; and calculating motor load based on motor speed.

31. The method of claim 30, wherein said processing step further comprises the step of determining motor run time in each of a plurality of motor load ranges.

32. A system for monitoring the condition of one or more ac machines, the system comprising:

for each of said one or more ac machines, at least one monitor attached to the machine for sensing and storing a plurality of operating parameters of the machine, said stored parameters corresponding to the operation history of the machine, wherein said at least one monitor includes;

a structural enclosure;

an engagement surface formed on said enclosure;

means for attaching said enclosure to the machine so that said engagement surface is adjacent the machine;

a power source disposed in said enclosure for supplying dc electrical power to the monitor;

sensors disposed in said enclosure for sensing a plurality of sensed parameters of the motor and producing a plurality of sensor signals corresponding to the sensed parameters;

a signal processor disposed in said enclosure for receiving and processing the sensor signals to produce operating parameters of the machine based on the sensed parameters;

means for storing the operating parameters, said stored operating parameters corresponding to the operation history of the machine; and means for outputting at least the stored operation history of the machine; and a portable data collector for downloading the stored operation history of each machine.

* * * * *